United States Patent [19]

Gauthier et al.

[11] 4,418,096
[45] Nov. 29, 1983

[54] PROCESS FOR PREPARING LAYERS OF $HG_{1-x}CD_xTE$

[75] Inventors: André Gauthier, Paris; Jean C. F. Morand, Ozoir-la-Ferriere, both of France

[73] Assignee: Societe Anonyme de Telecommunications, France

[21] Appl. No.: 322,932

[22] Filed: Nov. 19, 1981

Related U.S. Application Data

[63] Continuation of Ser. No. 161,916, Jun. 23, 1980, abandoned.

[30] Foreign Application Priority Data

Jun. 29, 1979 [FR] France ............................ 79 17014

[51] Int. Cl.³ ............................................. B05D 3/04
[52] U.S. Cl. .................. 427/76; 204/192 P; 427/160
[58] Field of Search ............... 427/75, 76, 160; 204/192 P

[56] References Cited

U.S. PATENT DOCUMENTS 3,725,135  4/1973  Hager et al. .................... 148/175 X

FOREIGN PATENT DOCUMENTS 1447257  6/1966  France .

Primary Examiner—James R. Hoffman
Attorney, Agent, or Firm—Jacobs & Jacobs

[57] ABSTRACT

A process for preparing layers with a superficial composition of $Hg_{1-x}Cd_xTe$ comprising the steps of producing a wafer by forming a layer of superficial composition $Hg_{1-y}Cd_yTe$ on a substrate of CdTe, y being less than the desired value x, and subjecting this wafer to a thermal interdiffusion treatment at a temperature of between about 350° and about 750° C., under such conditions that the layer of $Hg_{1-y}Cd_yTe$ cannot decompose.

6 Claims, 4 Drawing Figures

PROCESS FOR PREPARING LAYERS OF $Hg_{1-x}Cd_xTe$

This is a continuation of Ser. No. 161,916, filed June 23, 1980, now abandoned.

The present invention relates to a process for preparing layers of $Hg_{1-x}Cd_xTe$, an alloy which may be used for manufacturing infrared detectors.

The alloy $Hg_{1-x}Cd_xTe$ may be considered as a mixture, in proportions defined by the value of x, of HgTe and CdTe, and possesses properties between those of the two materials. In particular, the energy gap width and therefore the spectral sensitivity range, are directly dependent on the value of x, this enabling the spectral sensitivity range to be adjusted simply by adjusting the value of x. Thus, the spectral sensitivity range is between 3 and 5 μm for $x \cong 0.3$ and between 8 and 14 μm for $x \cong 0.2$.

It must be understood that the value of x as used here defines the composition on the outer surface of the layer, as it is the superficial composition of the layer which determines the spectral sensitivity of the detector obtained.

French Pat. No. 1,447,257 describes a process for forming a deposit of HgTe on a substrate of CdTe by epitaxial growth, which consists in placing, face to face, a wafer of CdTe and a wafer of HgTe, with a determined spacing, inside a hermetically closed container, in creating a vacuum in the container and in taking the temperature to a constant high value of between about 500° and 600° C.

However, this process enables only layers constituted on the surface by pure HgTe to be obtained, i.e. in which $x=0$.

It is disclosed in the article: "A new process of crystal growth evaporation diffusion under isothermal conditions" by G. Cohen-Solal, Y. Marfaing and F. Bailly, which appeared in Proceedings of an International Conference on Crystal Growth, Boston, June 20-24, 1966, Pergamon Press, Oxford-New York, that the composition on the surface of the layer depends on the temperature, and that at relatively low temperatures, ranging from 350° to 450° C., $Hg_{1-x}Cd_xTe$ is produced on the surface of the layer.

However, at these low temperatures, the process of growth becomes extremely slow and the duration of the treatment is excessively long, particularly when it is desired to have a layer of thickness greater than 100 μm.

U.S. Pat. No. 3,725,135 discloses a process of the same type as that of the French patent mentioned above, but in which the value of x is adjusted by establishing in the treatment container an excess mercury vapour pressure, i.e. greater than that which normally results from the constituents present inside the container. The excess mercury vapour pressure is generated by introducing a certain quantity of mercury in the container.

However, this process only provides a mediocre homogeneity in thickness from the surface of the layer. In other words, the gradient $\Delta x/\Delta e$, e being the thickness of the layer, is too great. This prevents the subsequent use of the techniques applicable to massive materials. Moreover, the value x obtained depends a great deal on the excess mercury vapour pressure, so that the latter must be adjusted, with considerable precision. This is delicate, as the mercury vapour pressure depends both on the free volume in the container and on the quantity of mercury introduced.

The object of the invention is to provide a process for preparing layers of $Hg_{1-x}Cd_xTe$ which makes it possible to precisely adjust the value of x much more conveniently and to reduce the gradient $\Delta x/\Delta e$.

According to the invention, a wafer is produced by forming a layer of surface composition $Hg_{1-y}Cd_yTe$ on a substrate of CdTe, y being less than the desired final value x, and this wafer is subjected to a thermal interdiffusion treatment at a temperature of between about 350° and about 750° C., under conditions such that the layer of $Hg_{1-y}Cd_yTe$ cannot decompose.

The use according to the invention of thermal interdiffusion enables the gradient $\Delta x/\Delta e$ in the vicinity of the surface to be appreciably reduced.

The process according to the invention further makes it possible to obtain the desired composition from a layer of any composition, provided that the proportion y of cadmium of the starting layer is less than the final proportion x desired. In particular, the proportion y may be zero, i.e. the starting layer may be composed of HgTe.

As the increase in the proportion of cadmium results from a thermal interdiffusion, the treatment parameters are temperature and duration. The temperature is easy to monitor, and as the treatment is relatively long, the duration need not be defined with a high precision, an error on the duration having only little influence on the value x obtained.

To prevent the mercury contained in the layer $Hg_{1-y}Cd_yTe$ from passing in the vapour to effect decomposition of said layer, operation is preferably carried out under an excess mercury vapour pressure of 4 to 50 atmospheres. The value of this pressure need not be adjusted with precision, the preferred value being, however, about 12 atmospheres.

In an advantageous embodiment, a thin layer of CdTe is deposited on the layer of $Hg_{1-y}Cd_yTe$ on the wafer, before the heat treatment. The presence of this layer of CdTe assists in preventing evaporation of the mercury in the course of the heat treatment and avoids the appearance of surface defects during this treatment.

Further, an additional reduction in the gradient $\Delta x/\Delta e$ may be observed in the vicinity of the outer surface of the layer.

Moreover, it is possible to effect a selective deposit of the layer of CdTe to produce zones of different compositions, therefore of different spectral sensitivities, on the same wafer.

The invention will be more readily understood on reading the following description with reference to the accompanying drawings, in which.

Figure 3:
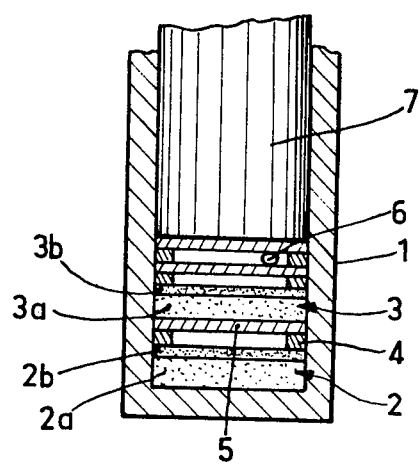

FIG. 3 schematically shows a device for carrying out the process according to the invention.

In the process according to the invention, a wafer is taken, constituted by a substrate of CdTe, on which a layer of $Hg_{1-y}Cd_yTe$ has been deposited, the value y being taken on the surface of the layer.

The deposit of the layer of $Hg_{1-y}Cd_yTe$ is preferably effected by epitaxial growth, in accordance with the teaching of French Pat. No. 1,447,257. To this end, a wafer of CdTe and a wafer of HgTe are disposed face to face, inside a hermetically closed container, with a well determined spacing between the wafers, vacuum is established inside the container and the temperature is increased to a value of 500° to 600° C.

Such a process leads to a layer whose superficial composition corresponds to a value $y \simeq 0$, i.e. formed on the surface of pure HgTe. Such a value is perfectly suitable within the scope of the invention.

If however, it is desired to start from a non-zero value y, the treatment temperature may be lowered to less than 450° C., as indicated in the above-mentioned article or, in accordance with the teaching of U.S. Pat. No. 3,725,135, an excess mercury vapour pressure may be generated inside the container by introducing a source of mercury therein.

It should be emphasized that the initial value y is not critical in the process according to the invention, and that the only condition to be respected is that it is less than the final value of x desired.

Figure 1A:
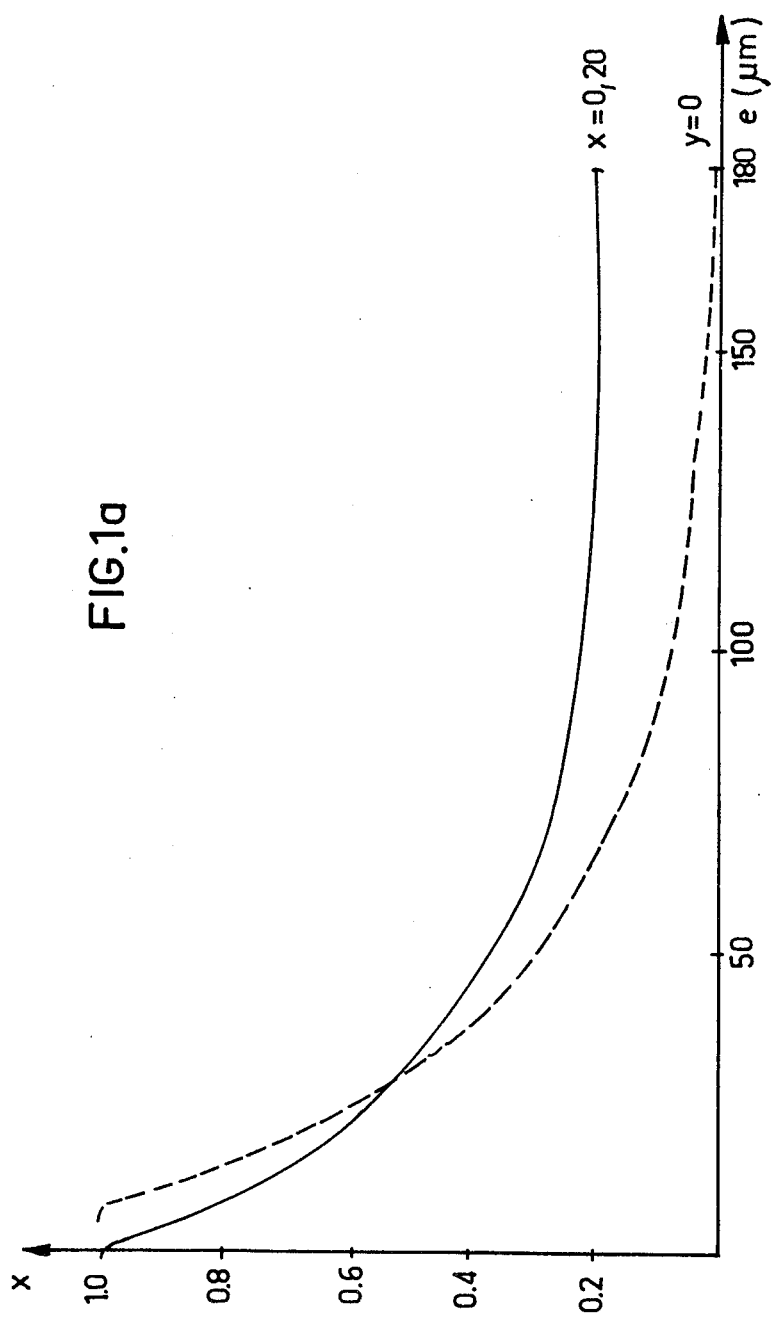
FIG. 1a shows two curves of the cadmium proportion as a function of the distance to the outer surface, before and after treatment according to the invention, respectively, in a first embodiment.

Referring now to the drawings, the dotted line curve of FIG. 1a shows, by way of example, the compositional profile of an epitaxial layer in the case $y=0$, the proportion of cadmium being on the y-axis and the position with respect to the outer surface, expressed in $\mu m$, being on the x-axis. The layer presents in the example shown a thickness of 180 $\mu m$.

Figure 1B:
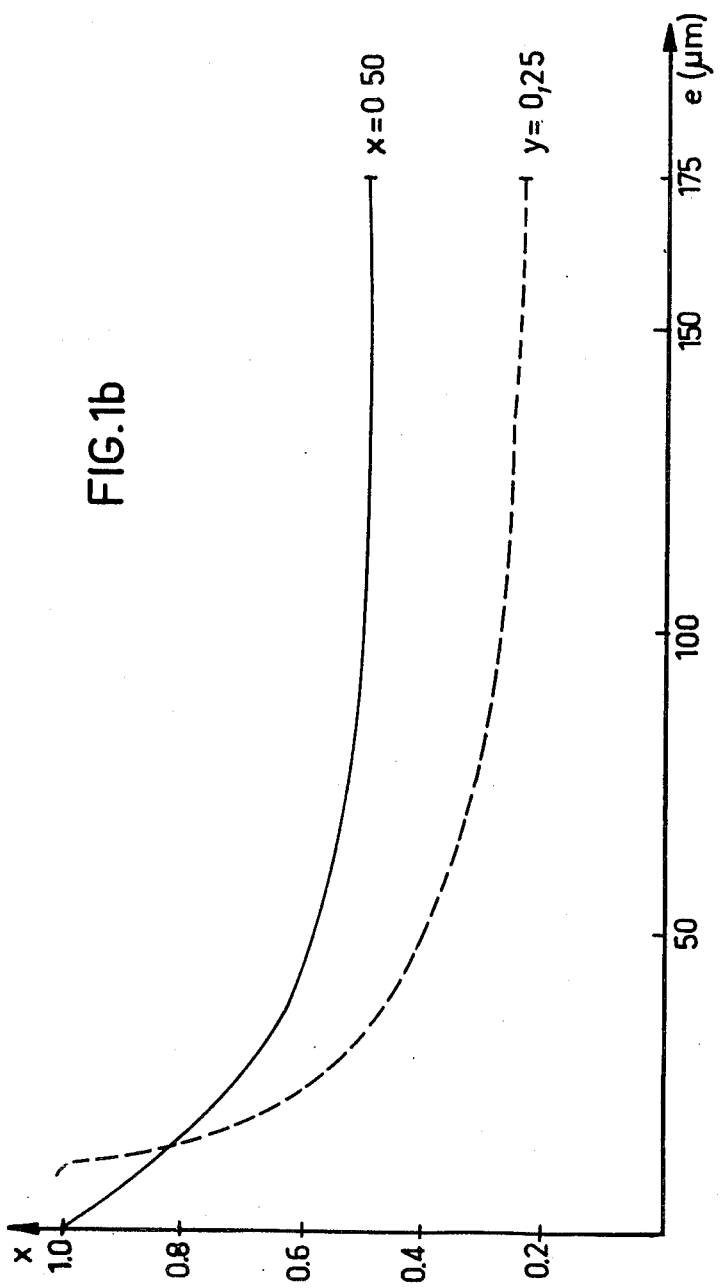
FIG. 1b is similar to FIG. 1a, and illustrates a second embodiment.

The dotted line curve of FIG. 1b similarly shows the profile of an epitaxial layer of 175 $\mu m$ thickness in the case of $y=0.25$.

It should be noted that, in the invention, the use of epitaxial growth for producing the starting layer is not imperative as other techniques may be envisaged. However, epitaxial growth is the most advantageous technique.

The invention provides increasing the proportion of cadmium in the superficial zone of the layer by a thermal interdiffusion treatment.

The thermal treatment is effected isothermally, at a temperature ranging from about 350° to about 750° C.

The maximum treatment temperature must in any case remain lower than the melting temperature of that compound which presents the highest mercury content. In the case $y=0$, the temperature must remain lower than 680° C., the melting temperature of HgTe.

On the other hand, it is preferred to operate at temperatures higher than 500° C., as temperatures lower than this value lead to exceedingly long treatment times.

Finally, in the case $y=0$, it is preferred to operate between 550° and 600° C.

Treatment being effected at high temperature, provision must be made so that the layer of $Hg_{1-y}Cd_yTe$ does not decompose by evaporation of the mercury. To this end, an additional source of mercury is introduced into the treatment container. Once a high vacuum is made in the container, the heating to treatment temperature causes establishment of a mercury vapour pressure which opposes the decomposition of $Hg_{1-y}Cd_yTe$.

The quantity of mercury introduced is such that the mercury pressure during treatment is between 4 and 50 atmospheres, and preferably between 4 and 12 atmospheres. The optimum value of the pressure of mercury is dependent on the initial value y and, of course, also on the treatment temperature. With $y=0$, it is about 6 atmospheres for a temperature of 550° C. and about 12 atmospheres for a temperature of 600° C.

The interdiffusion treatment according to the invention is fairly slow and currently takes from a few days to more than a month. The proportion of cadmium in the layer regularly increases as the treatment proceeds, with the result that, to obtain a given proportion x, it suffices to stop treatment at the appropriate moment.

The following Table illustrates the variation of proportion x in accordance with the duration of treatment, expressed in days, and of the thickness of the layer in $\mu m$, in the case of treatment at 550° C. and from a layer of HgTe ($y=0$) and a layer of $Hg_{1-y}Cd_yTe$ with $y=0.16$.

| Examples | Thickness of layer ($\mu m$) | Initial superficial composition (y) | Duration (in days) | Final superficial composition (x) |
|---|---|---|---|---|
| 1 | 158 | 0 | 18 | 0.25 |
| 2 | 167 | 0 | 8 | 0.16 |
| 3 | 167 | 0 | 20 | 0.25 |
| 4 | 178 | 0 | 10 | 0.16 |
| 5 | 190 | 0 | 11 | 0.16 |
| 6 | 190 | 0.16 | 10 | 0.21 |
| 7 | 190 | 0.16 | 14 | 0.24 |
| 8 | 205 | 0 | 19 | 0.19 |

It will be noted for example that, with a thickness of 167 $\mu m$, the value x is 0.16 after 8 days, and 0.25 after 20 days. The increase is therefore about 0.007/day, so that, taking into account the required precision on the superficial composition, the duration of the treatment can only be defined to within a day.

Of course, the durations of treatment will be reduced if the initial value y is not zero.

If for example, under the same conditions as previously, the starting layer is a layer of $Hg_{1-y}Cd_yTe$ with $y=0.16$, the duration of treatment is reduced by 8 days and the value $x=0.25$ will be obtained after only 12 days.

The solid line curve in FIG. 1a shows the compositional profile obtained by the interdiffusion treatment according to the invention effected at 550° C. under a mercury pressure of 6 atmospheres for 16 days. The value x thus obtained is 0.20.

It should be noted that the layer thus obtained has an excellent homogeneity in the vicinity of the surface, since, over a thickness of 70 $\mu m$ from the surface, the variation of x is only about 0.02. The compositional gradient $\Delta x/\Delta e$ is therefore small, of the order of $3.10^{-4}$.

Such a small gradient is very advantageous for subsequent treatments, as techniques applicable to massive materials may be used for this layer.

FIG. 1b illustrates another example where a value $x=0.55$ is achieved for the layer corresponding to the solid line curve, from the value $y=0.25$ of the epitaxial layer corresponding to the dotted line curve. In this example, the treatment is effected at 550° C. under a mercury pressure of 5 atmospheres for 30 days.

A reduction will be noted in the gradient $\Delta x/\Delta e$ in the vicinity of the surface, which passes from about $5.10^{-4}$ to $3.10^{-4}$.

If the gradients of the starting epitaxial layer of FIG. 1b and of the layer obtained according to the invention in the case of FIG. 1a, whose superficial compositions are similar (x=0.20; y=0.25), are compared, the same reduction in the gradient is observed in a ratio close to 2.

An advantageous embodiment of the process according to the invention consists in depositing, before the thermal interdiffusion treatment, a thin layer of CdTe on the layer of $Hg_{1-y}Cd_yTe$. This layer of CdTe preferably has a thickness of about 2 to 10 μm and particularly about 5 μm.

The deposition of the layer of CdTe is effected by any suitable technique, for example by evaporation in vacuo or by cathode sputtering.

Figure 2:
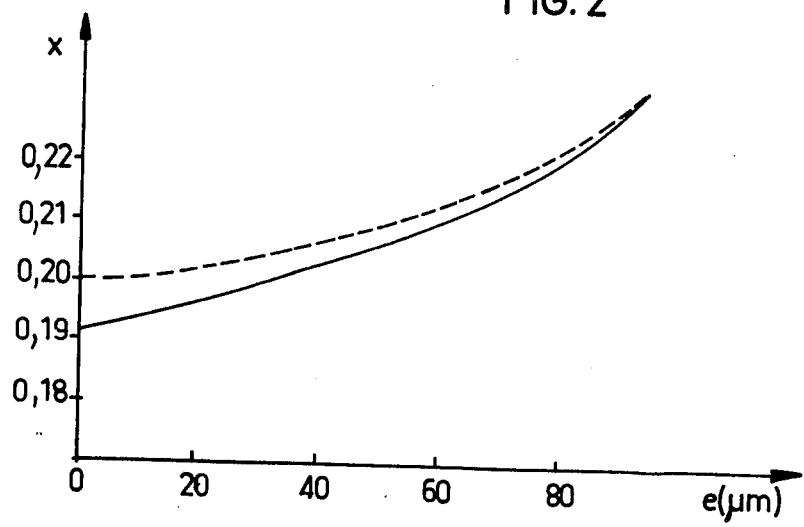
FIG. 2 shows, on an enlarged scale, two curves of the cadmium proportion as a function of the distance to the outer surface, with and without additional deposit of a CdTe layer, respectively.

As has been stated hereinabove, the risks of surface defects liable to appear during interdiffusion are thus eliminated and, on the other hand, as shown in FIG. 2, the gradient $\Delta x/\Delta e$ in the vicinity of the surface is substantially reduced.

In FIG. 2, the solid line curve corresponds to a layer obtained without additional deposit of CdTe, under the conditions corresponding to the example of FIG. 1a. The thickness is also taken from the outer surface.

It will be noted that the gradient $\Delta x/\Delta e$ is, in this case, about $3.10^{-4}$.

The dotted line curve corresponds to a layer prepared exactly under the same conditions, but with a deposit of a layer of CdTe of 5 μm.

It will be noted that the value x has slightly increased, from 0.19 to 0.20, and especially that the gradient $\Delta x/\Delta e$ is substantially reduced, since it is now only $1.5.10^{-4}$.

The deposit of CdTe may be selective, this enabling zones of different superficial compositions to be created on the same wafer.

FIG. 3 shows a device for carrying out the above-described process.

This device comprises a tube 1 made of quartz of high purity, inside which are stacked the wafers 2, 3 to be treated. Each wafer is composed of a CdTe substrate 2a (3a) and a layer 2b (3b) of $Hg_{1-y}Cd_yTe$. The layer of CdTe possibly deposited has not been shown.

The wafers 2, 3 are separated by a quartz ring 4 and by a quartz disc 5 placed against the outer surface of the CdTe substrate and serving as a mask.

The purpose of this arrangement is to prevent an epitaxial growth between the layer 2b of $Hg_{1-y}Cd_yTe$ and the substrate 3a of CdTe, whilst leaving the surface of the layer 2b free.

In FIG. 3, only two wafers have been shown, but any number of wafers may, of course, be stacked, each time with the interposition of a ring 4 and a disc 5.

Above the last disc 5 of the stack, a small quantity of mercury 6 is placed, a further ring and disc are arranged, then a piston 7 is introduced into the tube 1 to hold the whole in position.

Vacuum is then made inside the tube to about $10^{-6}$ mmHg, the tube is sealed and it is placed in the isothermal zone of a furnace.

What is claimed is:

1. A process for preparing layers of an alloy $Hg_{1-x}Cd_xTe$ useful in the manufacture of infrared detectors, comprising the steps of introducing into a tube a wafer having a substrate of Cd Te and a superficial layer of $Hg_{1-y}Cd_yTe$, the value of y being less than the desired value of x, applying a mask above the wafer adding a quantity of mercury above the mask, introducing a piston into the tube for holding the whole in position, creating a vacuum inside the tube, sealing the tube, placing the tube in a furnace whose temperature is between 350° C. and 750° C. to subject the wafer to a thermal interdiffusion treatment without decomposing the layer of $Hg_{1-y}Cd_yTe$.

2. The process as claimed in claim 1, wherein said wafer is subjected to said thermal interdiffusion treatment under a mercury pressure of between 4 and 50 atmospheres.

3. The process as claimed in claim 2, wherein the mercury pressure is between 6 and 12 atmospheres.

4. The process as claimed in claim 1, wherein prior to the thermal treatment, a thin layer of CdTe is deposited on the wafer over the layer of $Hg_{1-y}Cd_yTe$.

5. The process as claimed in claim 4, wherein the thickness of the CdTe layer is about 5 μm.

6. The process as claimed in claim 1, wherein the furnace temperature ranges from about 550° C. to about 600° C.

* * * * *